(12) United States Patent
Horikawa et al.

(10) Patent No.: US 11,152,541 B2
(45) Date of Patent: Oct. 19, 2021

(54) SUBSTRATE AND PLANAR ILLUMINATION DEVICE

(71) Applicant: MINEBEA MITSUMI Inc., Nagano (JP)

(72) Inventors: Tomotaka Horikawa, Hamamatsu (JP); Makoto Furuta, Fukuroi (JP)

(73) Assignee: MINEBEA MITSUMI INC., Nagano (JP)

( * ) Notice: Subject to any disclaimer, the term of this patent is extended or adjusted under 35 U.S.C. 154(b) by 0 days.

(21) Appl. No.: 16/188,617

(22) Filed: Nov. 13, 2018

(65) Prior Publication Data

US 2019/0189847 A1 Jun. 20, 2019

(30) Foreign Application Priority Data

Dec. 14, 2017 (JP) .............................. JP2017-239451

(51) Int. Cl.
*H01L 33/24* (2010.01)
*F21V 8/00* (2006.01)
*H01L 33/62* (2010.01)
*H01L 33/20* (2010.01)

(52) U.S. Cl.
CPC .............. *H01L 33/24* (2013.01); *G02B 6/005* (2013.01); *H01L 33/20* (2013.01); *H01L 33/62* (2013.01)

(58) Field of Classification Search
CPC ......... H01L 33/62; H01L 33/20; H01L 33/24; G02B 6/0091; G02B 6/0083; G02B 6/005; G02B 6/0068
USPC ..................................................... 257/13, 79
See application file for complete search history.

(56) References Cited

U.S. PATENT DOCUMENTS

| 6,383,835 | B1* | 5/2002 | Hata ....................... H01L 24/97 257/433 |
| 7,909,480 | B2* | 3/2011 | Kang ................... G02B 6/0073 362/249.02 |
| 2006/0220030 | A1* | 10/2006 | Tain .......................... F21K 9/00 257/79 |
| 2006/0231953 | A1* | 10/2006 | Murata .................. H05K 1/111 257/738 |
| 2014/0217456 | A1 | 8/2014 | Ahn et al. |
| 2015/0342045 | A1* | 11/2015 | Nakabayashi ......... H05K 1/111 362/611 |
| 2016/0029485 | A1* | 1/2016 | Dummer ................ B23K 31/02 362/382 |

(Continued)

FOREIGN PATENT DOCUMENTS

| JP | 2016-072365 A | 5/2016 |
| JP | 2017-069013 A | 4/2017 |
| JP | 2017-188589 A | 12/2017 |

OTHER PUBLICATIONS

Notice of Reasons for Refusal dated Nov. 12, 2019 for corresponding Japanese Application No. 2017-239451 and English translation.

(Continued)

*Primary Examiner* — Hrayr A Sayadian
(74) *Attorney, Agent, or Firm* — Pearne & Gordon LLP (57) ABSTRACT

A substrate according to an embodiment includes a plurality of land portions that are bonded to a plurality of terminals of a light source via solder, respectively, the light source having the terminals on a surface other than a light-emitting surface, each of the land portions having a cutout provided by cutting in accordance with a shape of the corresponding terminal.

21 Claims, 7 Drawing Sheets

(56) References Cited

U.S. PATENT DOCUMENTS

2017/0090108 A1* 3/2017 Furuta .................. H05K 3/3442

OTHER PUBLICATIONS

Decision to Grant a Patent dated Aug. 13, 2020 for corresponding Japanese Application No. 2017-239451 and English translation.

* cited by examiner

SUBSTRATE AND PLANAR ILLUMINATION DEVICE

CROSS-REFERENCE TO RELATED APPLICATIONS

The present application claims the benefit of priority to Japanese Patent Application No. 2017-239451 filed in Japan on Dec. 14, 2017, the entire contents of which are herein incorporates by reference.

BACKGROUND OF THE INVENTION

1. Field of the Invention

The present invention relates to a substrate and a planar illumination device.

2. Description of the Related Art

For example, a planar illumination device has been conventionally known where light emitted from a light source that is mounted on a substrate is incident on a light guide plate and light is output from the light guide plate in a planar fashion. In the planar illumination device, the substrate includes a land portion serving as an electrode on a mounting surface thereof and the land portion is soldered to a terminal provided on a side surface of the light source (see Japanese Patent Application Publication No. 2017-188589 and Japanese Patent Application Publication No. 2016-072365, for example).

However, in such a conventional technology, depending on a flow of solder during a reflow process, for example, a bonding surface between a land portion and the solder may be shifted from an originally intended position thereof. If the bonding surface is shifted, a mounting position for a light source, and accordingly, a position of the light source with respect to a light guide plate, may also be shifted in association with such a shift.

SUMMARY OF THE INVENTION

A substrate according to one aspect of the present invention includes a plurality of land portions that are bonded to a plurality of terminals of a light source via solder, respectively, the light source having the terminals on a surface other than a light-emitting surface, each of the land portions having a cutout provided by cutting in accordance with a shape of the corresponding terminal.

DETAILED DESCRIPTION OF THE PREFERRED EMBODIMENTS

Hereinafter, a substrate and a planar illumination device according to an embodiment will be explained with reference to the drawings. Relations between sizes of elements, ratios of the elements, and the like in the drawings may be different from those in reality. Some elements may be included where the relations between sizes, the ratios, and the like vary among the drawings. To facilitate understanding of explanations, a three-dimensional Cartesian coordinate system where a positive Z-axis direction represents a direction of output of light from the planar illumination device may be included in the drawings.

Figure 1:
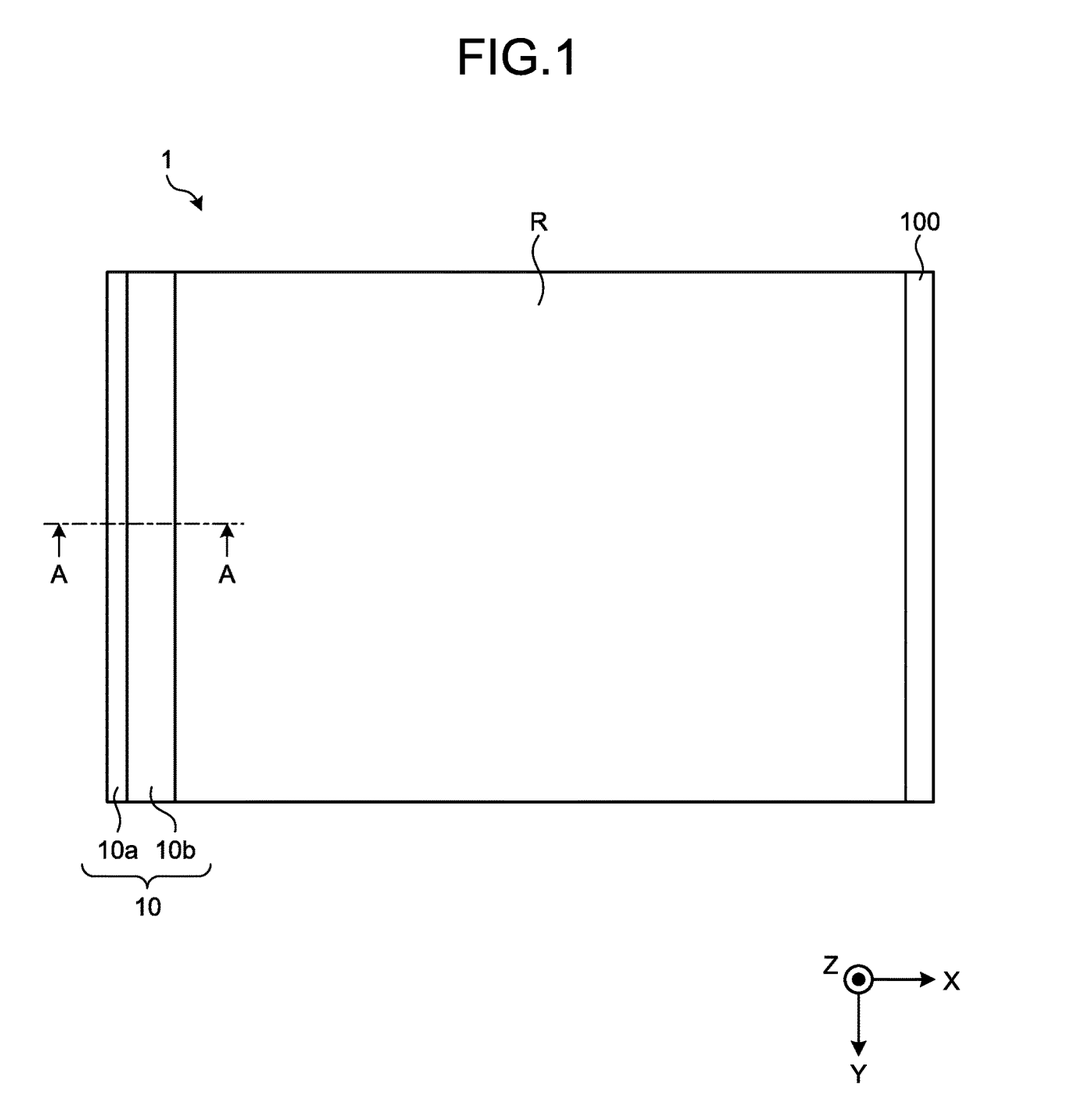
FIG. 1 is a front view illustrating one example of an external appearance of a planar illumination device according to an embodiment.

FIG. 1 is a front view illustrating one example of an external appearance of a planar illumination device according to the embodiment. As illustrated in the example in FIG. 1, a planar illumination device 1 according to the embodiment has a substantially rectangular shape in the top view. One end of the planar illumination device 1 in a longitudinal direction thereof (X-axis direction) is covered by a light-shielding sheet 10 that includes a first light-shielding sheet 10a and a second light-shielding sheet 10b. The other end of the planar illumination device 1 in the longitudinal direction is covered by a light-shielding sheet 100.

In the planar illumination device 1, light is output from a light-emitting region (also referred to as a light-emitting area) R that is not covered by the light-shielding sheets 10, 100. In other words, the light-shielding sheets 10, 100 define the light-emitting region R. The planar illumination device 1 according to the embodiment is used as a backlight of a liquid crystal display device. Such a liquid crystal display device is used for a smartphone, for example.

The light-shielding sheet 10 has a width greater than that of the light-shielding sheet 100, as illustrated in FIG. 1. This is because, while the light-shielding sheet 100 covers a light guide plate, a diffusion sheet, and a prism sheet, which will be described later, provided below the light-shielding sheet 100, that is, provided on the side of a negative Z-axis direction, the light-shielding sheet 10 covers a relatively large area that further includes a light emitting diode (LED) and a flexible printed circuit (FPC), which will be described later, and the like, in addition to a light guide plate, a diffusion sheet, and a prism sheet, which will be described later, provided below the light-shielding sheet 10.

Figure 2:
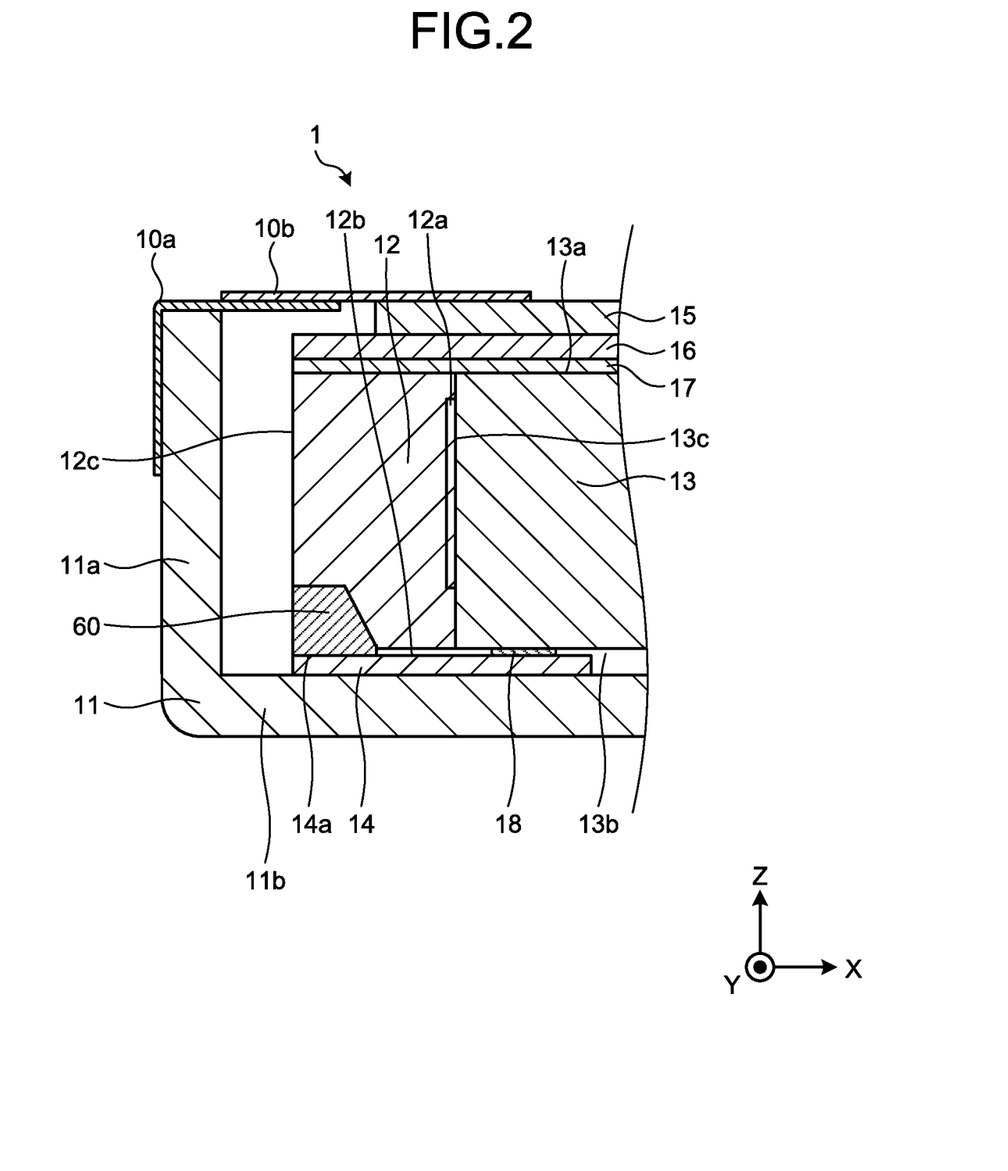
FIG. 2 is a cross-sectional view of the planar illumination device according to the embodiment.

Next, a structure of the planar illumination device 1 according to the embodiment will now be explained using FIG. 2. FIG. 2 is a cross-sectional view of the planar illumination device 1 according to the embodiment. FIG. 2 is a cross-sectional view of the planar illumination device 1 cut along line A-A illustrated in FIG. 1, when viewed from a positive Y-axis direction.

As illustrated in FIG. 2, the planar illumination device 1 includes the first light-shielding sheet 10a, the second light-shielding sheet 10b, a frame 11, LEDs 12, a light guide plate 13, an FPC 14, a prism sheet 15, a diffusion sheet 16, a first coupling member 17, and a second coupling member 18.

The frame 11 is a housing made of a material such as metal or resin. The frame 11 has a side wall 11a and a bottom 11b, and houses the LEDs 12, the light guide plate 13, the FPC 14, the prism sheet 15, the diffusion sheet 16, the first coupling member 17, and the second coupling member 18.

The LED 12 is a point-like light source, for example, and in the present embodiment, the LEDs 12 are arranged in a Y-axis direction that is a transverse direction of the planar illumination device 1. The LED 12 is, for example, a quasi-white LED composed of a blue LED and phosphors.

Figure 3:
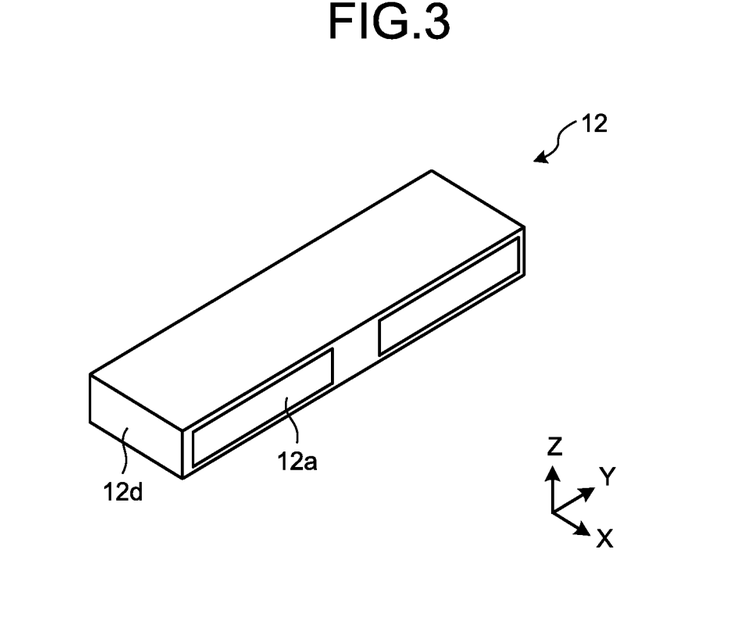
FIG. 3 is a diagram illustrating an external appearance of an LED.

The LED 12 has a light-emitting surface 12a, a bottom surface 12b intersecting with (being orthogonal to, for example) the light-emitting surface 12a, a rear surface 12c that is a surface on the opposite side of the light-emitting surface 12a, and side surfaces 12d intersecting with the light-emitting surface 12a and the bottom surface 12b (see FIG. 3). The light-emitting surface 12a is a surface that outputs light toward a positive X-axis direction, that is, toward the side of the light guide plate 13, which will be described later. The bottom surface 12b is a surface that faces a mounting surface 14a of the FPC 14, which will be described later.

The bottom surface 12b has recesses that are formed at positions corresponding to terminals (electrode terminals) of the LED 12, and the terminals of the LED 12 are bonded to the FPC 14, which will be described later, by pouring solder 60 into such recesses. In other words, the LED 12 is a side-view LED where the bottom surface 12b that intersects with the light-emitting surface 12a is mounted on the FPC 14. Alternatively, the LED 12 may be a top-view LED where the rear surface 12c is mounted on the FPC 14. The terminals of the LED 12 do not have to be formed on the bottom surface 12b but may be provided on the rear surface 12c, for example, as long as they are provided on one of the surfaces other than the light-emitting surface 12a.

The light guide plate 13 is a plate-like member made of a transparent material (such as a polycarbonate resin), for example, and is formed into a substantially rectangular shape in the top view when viewed from the negative Z-axis direction. The light guide plate 13 has two principal surfaces 13a, 13b and a side surface 13c.

The side surface 13c is a light incidence surface (hereinafter referred to as a light incidence surface 13c) that faces the light-emitting surface 12a of the LED 12, where light emitted from the light-emitting surface 12a is incident thereon. In other words, the planar illumination device 1 according to the embodiment is a so-called edge-lit illumination device where the LEDs 12 are arranged along an edge (light incidence surface 13c) of the light guide plate 13.

The principal surface 13a is a principle surface intersecting with the light incidence surface 13c, and is an output surface (hereinafter referred to as an output surface 13a) where light incident on the light incidence 13c is output therefrom. The principal surface 13b is a principal surface (hereinafter referred to as an opposite surface 13b) that is provided on the opposite side of the output surface 13a. A light path changing pattern composed of a plurality of dots, for example, is formed on the opposite surface 13b. Thereby, a traveling direction of light that travels through the light guide plate 13 is changed so that a larger amount of light is output from the output surface 13a.

The light guide plate 13 may be provided with a wedge portion on the side surface 13c, for example. Specifically, the light guide plate 13 may be provided with a wedge portion where the thickness of the light guide plate 13 gradually decreases from the side of the side surface 13c toward the positive X-axis direction that is a longitudinal direction of the light guide plate 13.

The FPC 14 is a flexible substrate (circuit board) where the LEDs 12 are mounted thereon, for example. The FPC 14 is, however, merely one example of the substrate, and may be a rigid substrate. The FPC 14 has a strip-like shape with a longitudinal direction that is a Y-axis direction, for example, and has a mounting surface 14a where the LEDs 12 are arranged thereon in such a longitudinal direction. Specifically, the LEDs 12 are bonded to land portions that are provided on the mounting surface 14a of the FPC 14, where such a point will be described later.

The FPC 14 is connected to a non-illustrated driving circuit, and such a driving circuit controls turning on and off the LEDs 12. Although the FPC 14 is provided on the side of the bottom 11b of the frame 11, the FPC 14 may be provided on the side of the output surface 13a of the light guide plate 13. Specifically, the FPC 14 may be provided on the side of a top surface that is the side of the positive Z-axis direction or the opposite side of the bottom surface 12b of the LED 12. When a top-view LED is to be used as a light source, the FPC may be provided on the side wall 11a of the frame 11.

In a conventional planar illumination device, to mount an LED on an FPC, each terminal of the LED is bonded to a rectangular land portion of the FPC using solder, so that a bonding surface based on the shape of the terminal is formed on the land portion, and the LED is mounted thereby. In the conventional FPC, however, the bonding surface between the land portion and the solder may be shifted from an originally intended position thereof, depending on a flow of the solder during a reflow process, for example. If the bonding surface is shifted, a mounting position of the LED may also be shifted in association with such a shift.

Figure 5:
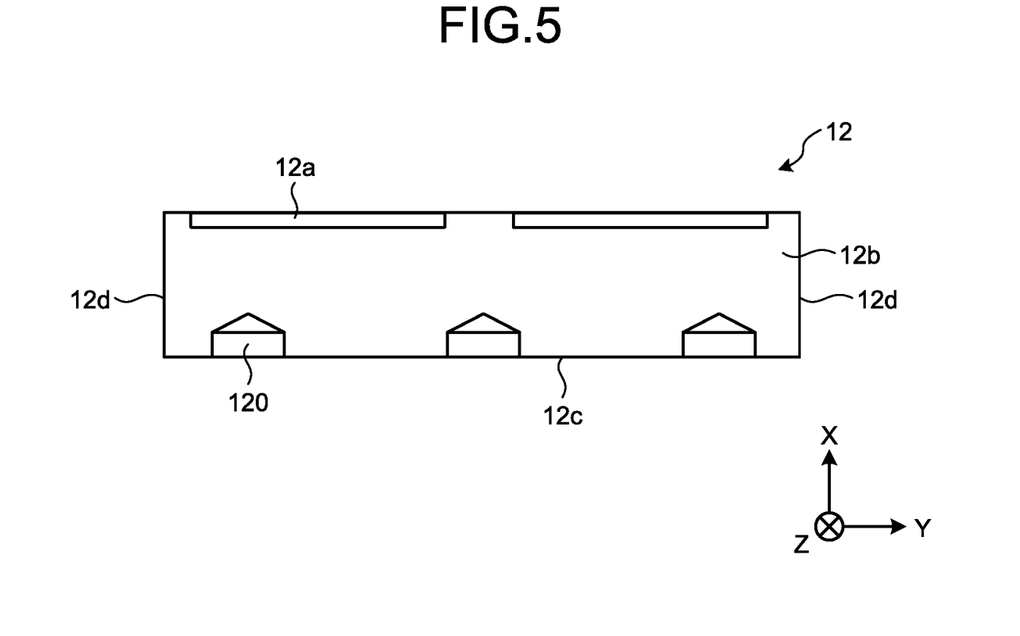
FIG. 5 is a diagram illustrating the external appearance of the LED.

Hence, in the FPC 14 in the planar illumination device 1 according to the embodiment, land portions 140 having a rectangular shape (see FIG. 7), for example, as a general shape include cutouts 50a, 50b (see FIG. 8) provided by cutting in accordance with the shape of the terminal 120 (see FIG. 5).

Such cutouts 50a, 50b regulate a flow of the solder 60, and, as a result, the bonding surface 60a based on the shape of the terminal 120 (see FIG. 8) is positioned (self-aligned) by the cutouts 50a, 50b. In other words, the position of the terminal 120 is restricted during a reflow process, for example, so that positional shift of the terminal 120 does not readily occur, and accordingly, a mounting position of the LED 12 can be defined highly accurately. The details of the cutouts 50a, 50b will be described later with reference to FIG. 8 and thereafter.

The prism sheet 15 controls distribution of light diffused by the diffusion sheet 16, which will be described later, and outputs the light with controlled distribution to an output direction of the light that is the positive Z-axis direction.

The diffusion sheet 16 is provided on the side of the output surface 13a of the light guide plate 13, and diffuses light output from the output surface 13a. Specifically, for example, the diffusion sheet 16 is arranged so as to cover the output surface 13a, and diffuses light output from the output surface 13a.

The first coupling member 17 and the second coupling member 18 are pieces of double-sided tape, for example. The first coupling member 17 couples the LED 12 to the light guide plate 13 optically or structurally. Specifically, the first coupling member 17 couples the light-emitting surface 12a of the LED 12 to the light incidence surface 13c of the light guide plate 13.

The second coupling member 18 is a member arranged to be interposed between the opposite surface 13b of the light guide plate 13 and the FPC 14, and fixes the light guide plate 13 to the FPC 14. For example, one surface of the second coupling member 18 adheres to at least a part of the mounting surface 14a of the FPC 14, on the side close to the light guide plate 13, and adheres to at least a part of the opposite surface 13b of the light guide plate 13, on the side close to the LED 12.

Figure 4:
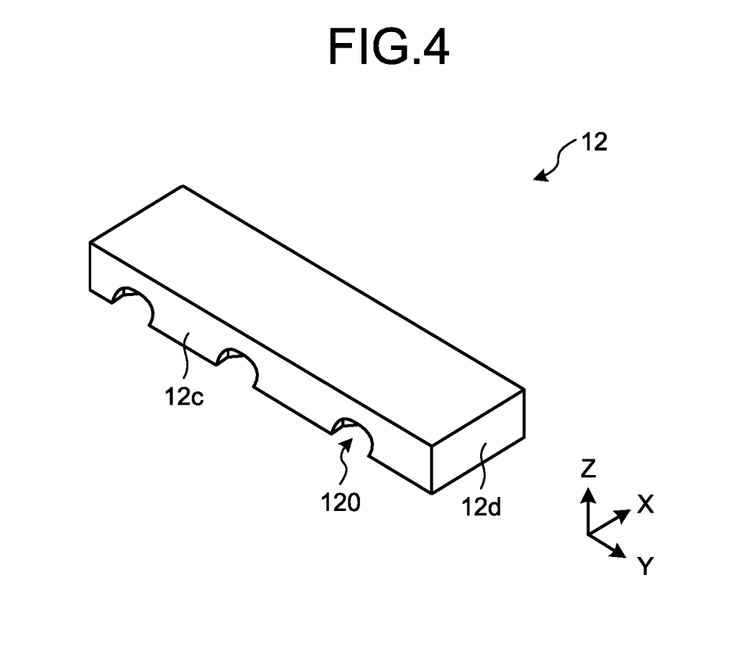
FIG. 4 is a diagram illustrating the external appearance of the LED.
Figure 6:
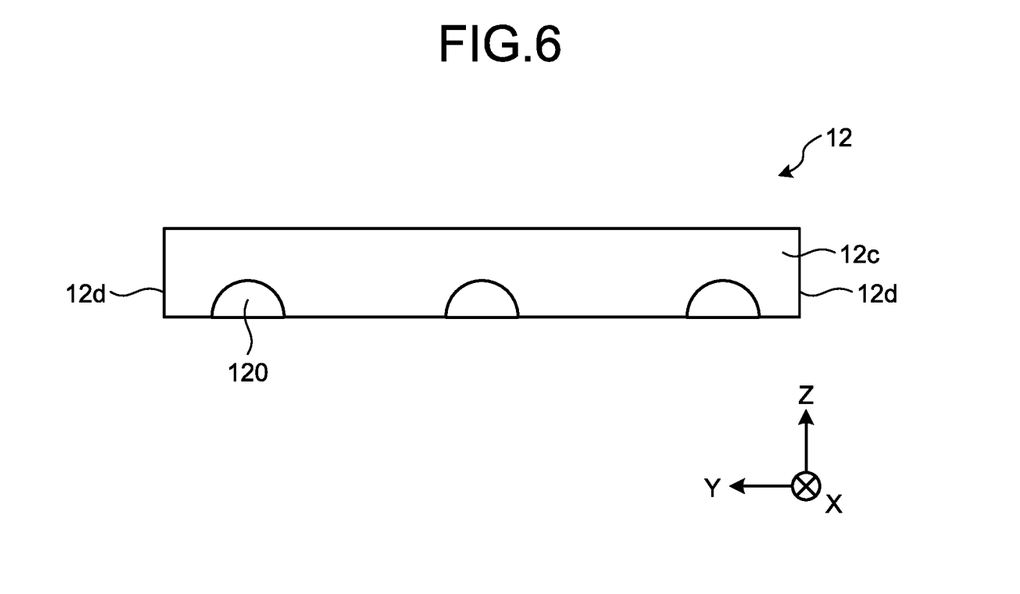
FIG. 6 is a diagram illustrating the external appearance of the LED.

Next, the LED 12 will be further explained using FIGS. 3 to 6. FIGS. 3 to 6 are diagrams illustrating an external appearance of the LED 12. FIGS. 3 and 4 are perspective views of the LED 12. FIG. 5 is a diagram of the LED 12 when viewed from a side of the bottom surface 12b that is in the negative Z-axis direction. FIG. 6 is a diagram of the LED 12 when viewed from a side of the rear surface 12c that is in the negative X-axis direction.

As illustrated in FIG. 3, one LED 12 has a substantially rectangular solid shape having a longitudinal direction that is in the Y-axis direction, and has two light-emitting surfaces 12a with substantially identical surface areas. The number of the light-emitting surfaces 12a provided to one LED 12 is not limited to two, and may be one, or three or more. The two light-emitting surfaces 12a may have different surface areas, instead of substantially identical surface areas.

As illustrated in FIGS. 4 to 6, recesses are provided on the corner where the bottom surface 12b intersects with the rear surface 12c of the LED 12, and the terminals 120 are provided on inner surfaces of these recesses. Such recesses can be referred to as a part of the bottom surface 12b (or the rear surface 12c). In other words, the terminals 120 can be referred to as being provided to the bottom surface 12b (or the rear surface 12c).

Specifically, each terminal 120 is provided on the circumferential surface of the recess having a shape of a half cylinder shape combined with a half cone shape, and is electrically connected to the FPC 14 when the solder 60 is poured into such recess. The shape of the recess where the terminal 120 is provided therein is not limited to the shape of a half cylinder shape combined with a half cone shape, and may be any recessed shape.

Figure 7:
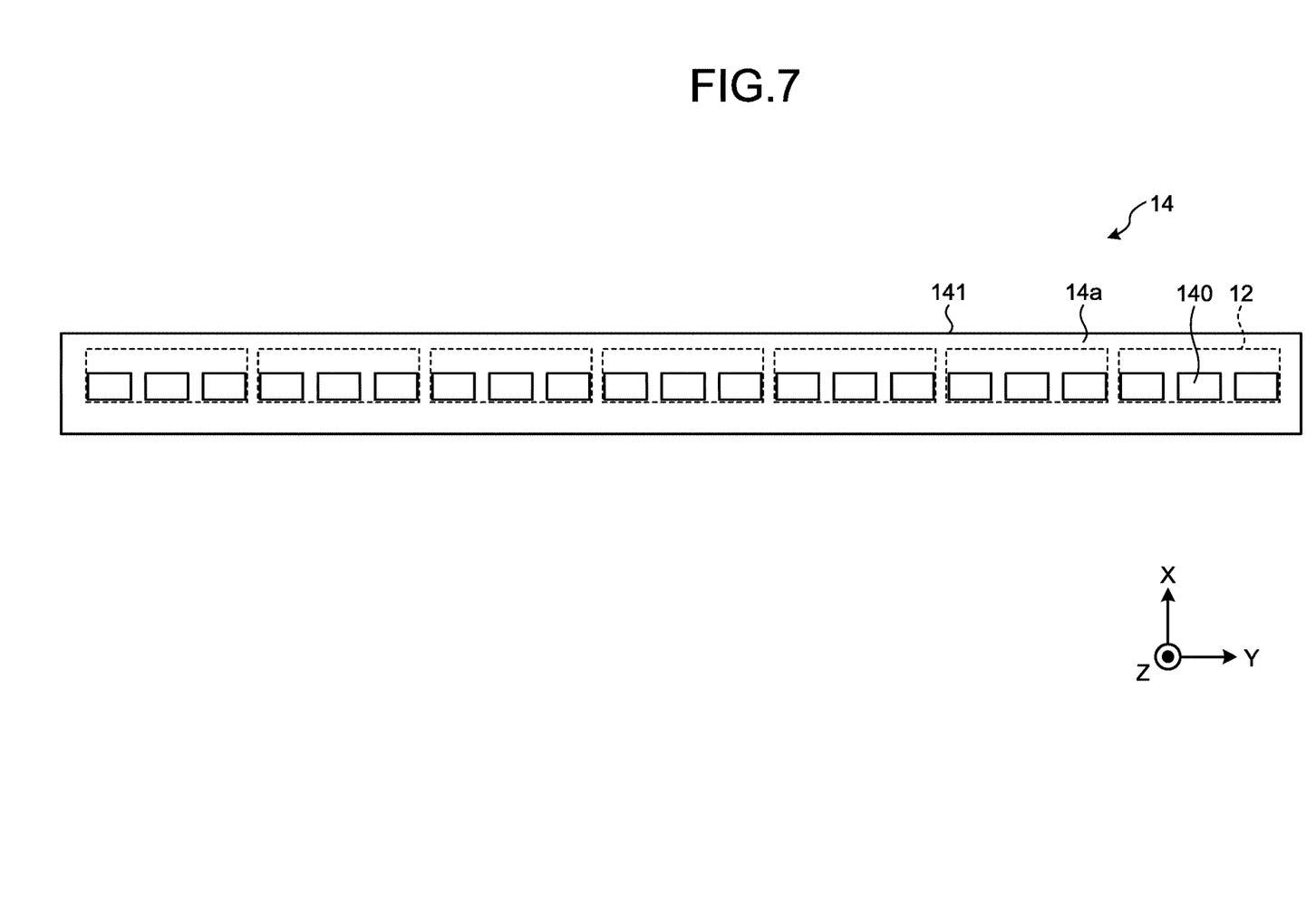
FIG. 7 is a front view of an FPC.

Next, the FPC 14 will be further explained using FIG. 7. FIG. 7 is a front view of the FPC 14. In FIG. 7, to facilitate understanding, dotted lines represent mounting positions of the LEDs 12 that are arranged in a longitudinal direction of the FPC 14. In the example illustrated in FIG. 7, although seven LEDs 12 are provided on the FPC 14, the number of the LEDs 12 may be any number.

As illustrated in FIG. 7, the FPC 14 includes land portions 140 and a base 141. The base 141 is a plate-like member, and the land portions 140 and a metal pattern such as wirings are formed on the base 141. A plurality of land portions 140 are provided on the mounting surface 14a of the base 141. The land portion 140 is a conductive electrode made of a metallic material such as copper foil, and is a part bonded to the terminal 120 of the LED 12 via the solder 60 (see FIG. 2). As illustrated in FIG. 7, the land portions 140 are arranged linearly along the Y-axis direction that is the longitudinal direction of the FPC 14.

The land portions 140 are bonded to the respective terminals 120 of the LED 12. In other words, One LED 12 is bonded to the land portions 140 where the number of the land portions 140 is identical to the number of the terminals 120 (see FIG. 5). In other words, as illustrated in FIG. 7, in the present embodiment, one LED 12 is bonded to three land portions 140.

The mounting surface 14a of the FPC 14 is provided with only the land portions 140. The wirings to be electrically connected to the land portions 140 are provided on the non-illustrated rear surface on the opposite side of the mounting surface 14a, and such wirings are connected to a driving circuit for driving the LEDs 12.

Figure 8:
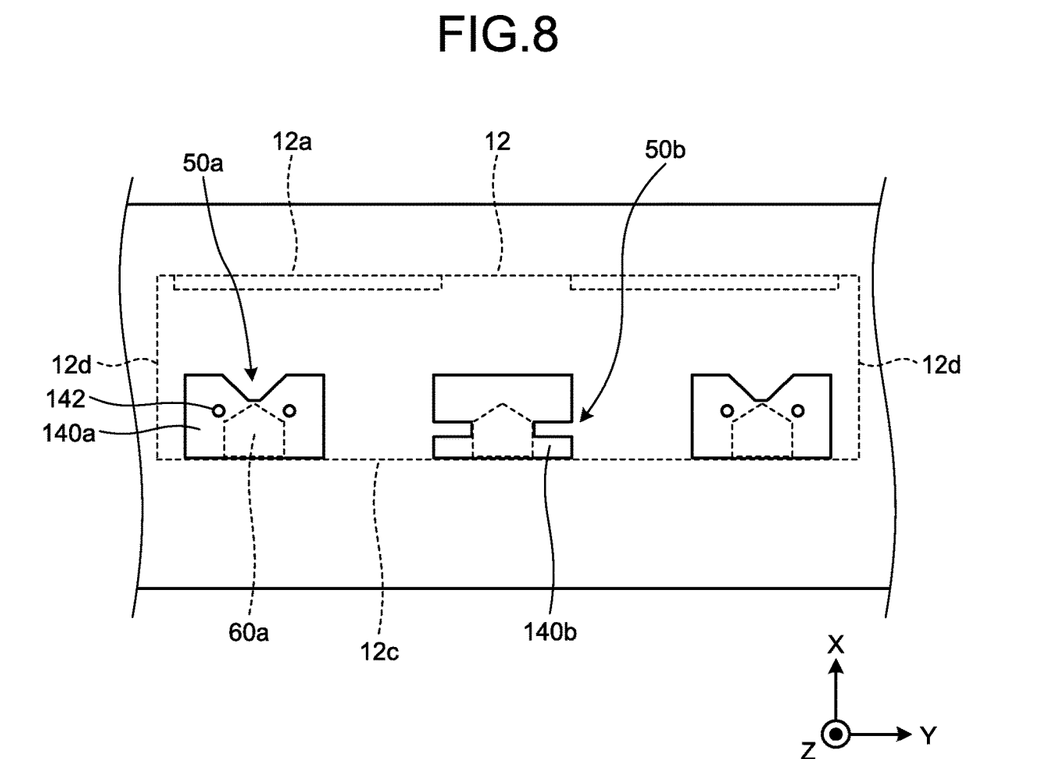
FIG. 8 is a front view of a land portion.

Next, the land portions 140 will be further explained using FIG. 8. FIG. 8 is a front view of the land portions 140. FIG. 8 illustrates a positional relation between one LED 12 (dotted line) and three land portions 140. In FIG. 8, the bonding surface 60a between the land portion 140 and the solder 60 is indicated by a dotted line. As illustrated in FIG. 8, the LED 12 is arranged at a position covering first land portions 140a and a second land portion 140b. The first land portions 140a and the second land portion 140b are provided on the side of the rear surface 12c of the LED 12 that is the opposite side of the light-emitting surface 12a, and are interposed between the two side surfaces 12d of the LED 12.

As illustrated in FIG. 8, the land portions 140 include the first land portions 140a and the second land portion 140b that have different outer shapes. The first land portion 140a has conducting portions 142 formed thereon. The conducting portions 142 are via holes, for example, and are parts that are electrically connected to the wirings provided on the non-illustrated rear surface of the FPC 14.

In the example illustrated in FIG. 8, although the conducting portions 142 are provided only to the first land portions 140a, the conducting portions 142 may also be provided to the second land portion 140b.

Furthermore, as illustrated in FIG. 8, the first land portion 140a has a cutout 50a and the second land portion 140b has cutouts 50b, where these cutouts are provided at different positions.

Specifically, the first land portion 140a has the cutout 50a provided by cutting the side of the light-emitting surface 12a that is in the positive X-axis direction, with respect to the bonding surface 60a. In other words, the first land portion 140a has the cutout 50a provided by cutting from the side of the light-emitting surface 12a. Thereby, when the terminal 120 of the LED 12 is bonded to the first land portion 140a by the solder 60, self-alignment prevents the bonding surface 60a from readily shifting toward the light-emitting surface 12a.

In other words, the cutout 50a restricts a position of the bonding surface 60a in the X-axis direction that is the transverse direction of the FPC 14. In other words, the cutout 50a in the first land portion 140a restricts a mounting position of the LED 12 in the transverse direction of the FPC 14. Thereby, a mounting position of the LED 12 in the transverse direction of the FPC 14 can be defined highly accurately. The cutout 50a extends to a circumferential edge of the bonding surface 60a, where such a point will be described later with reference to FIG. 9.

The second land portion 140b has a pair of cutouts 50b that are provided in such a manner that the sides facing the side surfaces 12d that are in the positive Y-axis direction and the negative Y-axis direction with respect to the bonding surface 60a are mutually cut inwardly. In other words, the second land portion 140b has cutouts 50b provided by cutting from the side of the side surfaces 12d, respectively. Thereby, when the terminal 120 of the LED 12 is bonded to the second land portion 140b by the solder 60, the bonding surface 60a can be prevented from readily shifting toward the side surface 12d.

In other words, the cutouts 50b restrict a position of the bonding surface 60a in the Y-axis direction that is the longitudinal direction of the FPC 14. In other words, the cutouts 50b in the second land portion 140b restrict a mounting position of the LED 12 in the longitudinal direction of the FPC 14. Thereby, a mounting position of the LED 12 in the longitudinal direction of the FPC 14 can be defined highly accurately. The cutouts 50b extend to a circumferential edge of the terminal 120, where such a point will be described later with reference to FIG. 10.

As illustrated in FIG. 8, the three land portions 140 are arranged in such a manner that the second land portion 140b is interposed between the two first land portions 140a. Thereby, a mounting position of the LED 12 in the transverse direction of the FPC 14 is restricted by the first land portions 140a that are provided on both sides of the second land portion 140b, and the mounting position in the longitudinal direction of the FPC 14 is restricted by the second land portion 140b.

The two first land portions 140a are arranged at both ends of the FPC 14 in the longitudinal direction, so that it is possible to effectively prevent occurrence of a positional shift of the LED 12 in such a manner that the LED 12 rotates on the mounting surface 14a that is the XY plane.

As illustrated in FIG. 8, the LED 12 covers the entire area of the first land portions 140a and the second land portion 140b. In other words, in the top view of the FPC 14 when viewed from the positive Z-axis direction, the land portions 140 do not protrude out of the LED 12 in the transverse direction of the FPC 14. Thereby, the length in the transverse direction of the FPC 14 can be reduced, so that further reduction of the frame width of the planar illumination device 1 can be realized.

The land portions 140 do no protrude out of the LED 12 in the longitudinal direction of the FPC 14, either. Therefore, it is possible to increase the number of the LEDs 12 that can be arranged in a unit length of the FPC 14, by reducing an interval between the LEDs 12, for example, and to improve the luminance of the planar illumination device 1.

Figure 9:
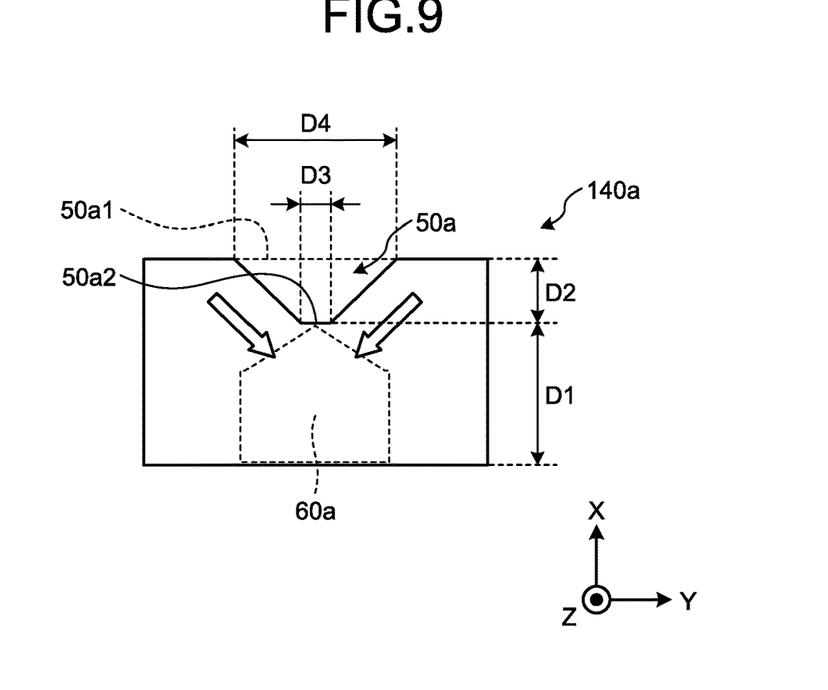
FIG. 9 is a front view of a first land portion.
Figure 10:
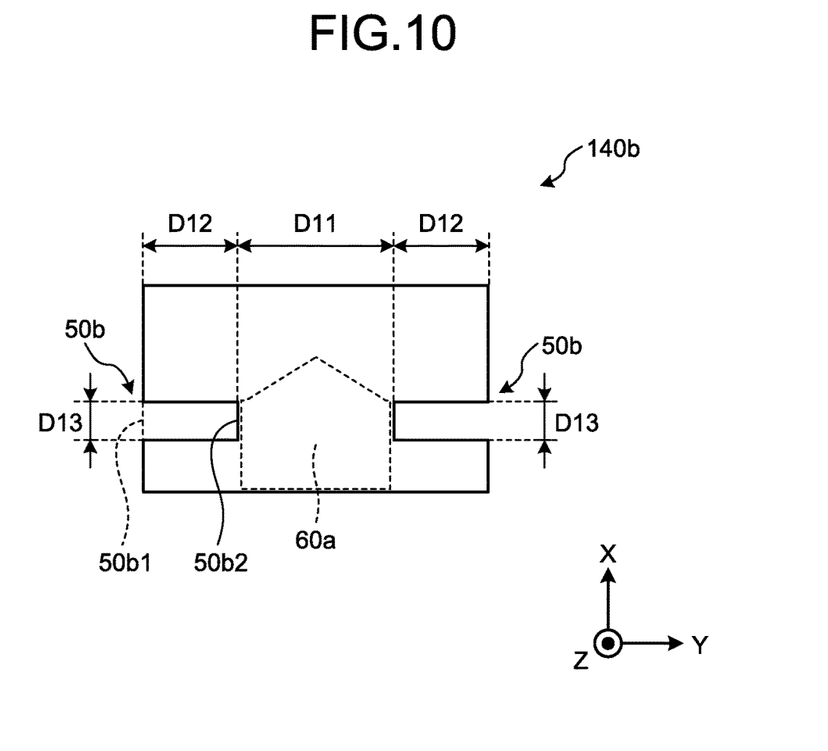
FIG. 10 is a front view of a second land portion.

Next, the land portions 140 will be further explained using FIGS. 9 and 10. FIG. 9 is a front view of the first land portion 140a. FIG. 10 is a front view of the second land portion 140b.

First, the first land portion 140a will be explained using FIG. 9. As illustrated in FIG. 9, the cutout 50a in the first land portion 140a extends to the circumferential edge of the bonding surface 60a or the vicinity thereof. The circumferential edge of the bonding surface 60a illustrated in FIG. 9 is also the circumferential edge of the terminal 120. In other words, the cutout 50a in the first land portion 140a can also be referred to as extending to the circumferential edge of the terminal 120. Specifically, the cutout 50a is formed at a position where a distal end 50a2 of the cutout 50a substantially contacts a tip of the tapered portion of the bonding surface 60a on the side of the cutout 50a.

More specifically, a cutout depth D2 of the cutout 50a is determined in such a manner that a length D1 from the distal end 50a2 of the cutout 50a to a circumferential edge of the first land portion 140a on the side of the negative X-axis direction (the side opposite to the light guide plate 13 in the transverse direction of the FPC 14) is substantially equal to the length of the bonding surface 60a in the X-axis direction (the transverse direction of the FPC 14). Thereby, there is no room for the bonding surface 60a to shift in each of the positive X-axis direction (toward the side of the light guide plate 13 in the transverse direction of the FPC 14) and the negative X-axis direction (toward the opposite side of the light guide plate 13 in the transverse direction of the FPC 14), so that a mounting position of the LED 12 in the transverse direction of the FPC 14 can be defined highly accurately.

As illustrated in FIG. 9, the cutout 50a is provided by cutting into a trapezoidal shape, for example. In other words, the cutout 50a is formed in such a manner that the distal end 50a2 has a predetermined length D3. Thereby, the bonding surface 60a is allowed to shift in the Y-axis direction (the longitudinal direction of the FPC 14) by the length D3, during a reflow process.

The cutout 50a is provided by cutting into a trapezoidal shape, that is, cutting into a tapered shape where the length D3 of the distal end 50a2 that is an end more distant from the light-emitting surface 12a is less than a length D4 of a proximal end 50a1 that is an end closer to the light-emitting surface 12a. Thereby, the solder 60 near the cutout 50a in the solder (paste) applied to the entire surface of the land portion 140 prior to reflow thereof is allowed to readily flow along the tapered shape in a reflow process (in the directions indicated by thick arrows in FIG. 9), so that the solder 60 flows into the recess of the terminal 120 that provided on the bonding surface 60a. As a result, a cavity that is caused by an insufficient amount of solder and is problematic if the cutout 50a is absent is not readily formed in the recess of the terminal 120, so that it is possible to prevent or reduce occurrence of defective connection of the terminal 20.

In the example illustrated in FIG. 9, although the trapezoidal shape of the cutout 50a is isosceles, the trapezoidal shape of the cutout 50a does not have to be isosceles. Alternatively, the cutout 50a is not limited to the trapezoidal shape and may have any shape as long as the distal end 50a2 has the predetermined length D3. The predetermined length D3 includes 0 (zero). For example, when a tip part of the bonding surface 60a (a part on the side of the cutout 50a) has a flat surface, the shape of the cutout 50a may be a triangular shape.

In the example illustrated in FIG. 9, although the cutout 50a is formed so as to extend to the bonding surface 60a, a slight gap may be present between the distal end 50a2 of the cutout 50a and the tip of the bonding surface 60a, by taking production errors into consideration, for example.

Next, the second land portion 140b will be explained using FIG. 10. As illustrated in FIG. 10, the second land portion 140b has two cutouts 50b that are provided by cutting from the positive Y-axis direction and the negative Y-axis direction, respectively, in the longitudinal direction of the FPC 14. Each of the two cutouts 50b in the second land portion 140b extends to the circumferential edge of the bonding surface 60a. As mentioned above, the circumferential edge of the bonding surface 60a is also the circumferential edge of the terminal 120. In other words, each of the two cutouts 50b in the second land portion 140b extends to the circumferential edge of the terminal 120.

Specifically, the cutouts 50b are formed at such positions that the distal ends 50b2 of the cutouts 50b contact a rectangular portion that is provided on the side of the negative X-axis direction (the transverse direction of the FPC 14) with respect to the tapered portion of the bonding surface 60a. More specifically, a cutout depth D12 of the cutouts 50b is determined in such a manner that a length D11 between the distal ends 50b2 of the two cutouts 50b is substantially equal to the length of the rectangular portion of the bonding surface 60a in the Y-axis direction.

Thereby, it is possible for the bonding surface 60a to have no room to shift in the Y-axis direction (the longitudinal direction of the FPC 14), so that a mounting position of the LED 12 in the longitudinal direction of the FPC 14 can be defined highly accurately.

The cutouts 50b are formed in such a manner that a height position that is in the X-axis direction is lower than the center of the second land portion 140b at a height position in the X-axis direction (on the side of the negative X-axis direction). Thereby, the cutouts 50b contact the rectangular portion of the bonding surface 60a. Therefore, even if the bonding surface 60a slightly shifts in the X-axis direction during a reflow process, the length in the Y-axis direction at a position to contact the bonding surface 60a is not changed. Therefore, the bonding surface 60a is reliably prevented from shifting in the longitudinal direction of the FPC 14 that is the Y-axis direction.

As illustrated in FIG. 10, the cutouts 50b are provided by cutting into a substantially rectangular shape with a predetermined cutout width D13, for example. Thereby, even if the cutouts 50b shift toward the positive X-axis direction (toward the light guide plate 13 in the transverse direction of the FPC 14) and the cutouts 50b partially overlap with the tapered portion of the bonding surface 60a, it is possible to provide a tolerance of the cutout width D13.

In the example illustrated in FIG. 10, although the cutouts 50b are formed into a substantially rectangular shape (that is, where the cutout widths D13 on the proximal end 50b1 and the distal end 50b2 are substantially identical), such a rectangular shape is not limiting and any other quadrangular shape such as a trapezoidal shape where the length of the distal end 50b2 is less than that of the proximal end 50b1, for example, may be provided. Alternatively, the cutout 50b is not limited to a quadrangular shape and may have a triangular shape where the cutout width D13 is reduced from the proximal end 50b1 toward the distal end 50b2, for example.

In the example illustrated in FIG. 10, although the two cutouts 50b both have substantially identical cutout depths D12, identical ones do not have to be provided. The cutout depths D12 of the two cutouts 50b may be different from each other as long as the length D11 between the two cutouts 50b is identical to the length of the rectangular portion of the bonding surface 60a. Similarly, the cutout widths D13 of the two cutouts 50b also do not have to be substantially identical.

In the example illustrated in FIG. 10, although the second land portion 140b has the two cutouts 50b, the cutout 50b may be formed on the bonding surface 60a in only one of the positive Y-axis direction and the negative Y-axis direction. In such a configuration, the cutout depth D12 of the cutout 50b is a total length of the cutout depths D12 of the two cutouts 50b illustrated in FIG. 10.

In other words, the bonding surface 60a is arranged to be close to the end of the second land portion 140b in the positive Y-axis direction or the negative Y-axis direction. Thereby, an mounting position of the LED 12 can be defined highly accurately, while reducing the number of steps for forming the cutouts 50b during a production process.

As described above, the FPC 14 (one example of the substrate) according to the embodiment includes the land portions 140 that are bonded to the terminals 120 of the LED 12 (one example of a light source) having the terminals 120 on a surface other than the light-emitting surface 12a (on the bottom surface 12b, for example), via the solder 60, and have the cutout(s) 50a, 50b provided by cutting in accordance with the shape of the corresponding terminal 120.

Thereby, the cutouts 50a, 50b restrict the position of the bonding surface 60a, so that a positional shift of the bonding surface 60a is prevented from readily occurring. As a result, a mounting position of the LED 12 can be defined highly accurately.

In the embodiment described above, although the two first land portions 140a are arranged so as to interpose the second land portion 140b therebetween, the two first land portions 140a may be arranged so as to interpose two second land portions 140b therebetween, for example. In other words, any number of the second land portions 140b may be interposed between the two first land portions 140a.

In the embodiment described above, although the first land portion 140a and the second land portion 140b restrict a mounting position of the LED 12 in directions orthogonal to each other (the transverse direction and the longitudinal direction of the FPC 14), each of the directions is not limited thereto.

In other words, as long as the land portions 140 restrict the mounting position in different directions, the directions do not have to be orthogonal to each other. The directions for restricting the mounting position by the land portions 140 are not limited to two directions (the transverse direction and the longitudinal direction of the FPC 14), and the mounting position may be restricted in three or more directions.

According to one aspect of the present invention, it is possible to provide a substrate and a planar illumination device where the mounting position for the light source can be defined highly accurately.

The present invention is not limited by the above-mentioned embodiment(s). The present invention also includes a configuration provided by appropriately combining respective components as described above. It is possible for a person skilled in the art to readily derive additional effect or illustrative variations. A broader aspect of the present invention is not limited to the embodiments as described above and various modifications thereof are allowed.

What is claimed is:

1. A planar illumination device comprising:
   a light source having a light-emitting surface and a plurality of terminals formed on a surface other than the light-emitting surface and extending in a first direction; and
   a substrate comprising a plurality of land portions each land portion being bonded to a corresponding terminal of the plurality of terminals of the light source via solder, and
   each of the land portions having a cutout provided by cutting a first side of the land portion toward the corresponding terminal, wherein:
   the cutout extends from the first side of the land portion toward a second direction different from the first direction,
   a bonding surface of the corresponding terminal does not include any cutout.

2. The planar illumination device according to claim 1, wherein
   the land portions include a first land portion and a second land portion that are bonded to the terminals provided on a bottom surface of the light source, the bottom surface being the surface intersecting with the light-emitting surface, and
   the first side of the first land portion where the cutout is formed is a side of the light-emitting surface, and
   the first side of the second land portion where the cutout is formed is a side of a side surface of the light source, the side surface intersecting with the light-emitting surface and the bottom surface.

3. The planar illumination device according to claim 2, wherein a length of the distal end of the cutout in the first land portion is less than a length of a proximal end thereof, the distal end being an end that is more distant from the light-emitting surface, and the proximal end being an end that is closer to the light-emitting surface.

4. The planar illumination device according to claim 2, wherein the land portions are arranged along a longitudinal direction of the substrate, and the second land portion is interposed between a plurality of the first land portions.

5. The planar illumination device according to claim 1, wherein the cutout in the land portion extends to a circumferential edge of the corresponding terminal in the top view.

6. The planar illumination device according to claim 1, wherein an entire area of the land portions is covered by the light source.

7. The planar illumination device according to claim 1, comprising the plurality of land portions that are bonded to the plurality of terminals of the light source, respectively, each of the land portions restricting a mounting position for the light source in a different direction.

8. The planar illumination device according to claim 7, wherein the land portions include:
the first land portion that restricts the mounting position in a transverse direction of the substrate, and
the second land portion that restricts the mounting position in a longitudinal direction of the substrate.

9. The planar illumination device according to claim 1, wherein the terminals are provided on a circumferential surface of a recess that is provided to the surface.

10. The planar illumination device according to claim 1, further comprising:
a light guide plate that has a side surface and an output surface that is a principal surface intersecting with the side surface, light emitted from the light source being incident on the side surface, and the light being output from the output surface.

11. The planar illumination device according to claim 7, wherein the terminals are provided on a circumferential surface of a recess that is provided to the surface.

12. The planar illumination device according to claim 7, further comprising:
a light guide plate that has a side surface and an output surface that is a principal surface intersecting with the side surface, light emitted from the light source being incident on the side surface, and the light being output from the output surface.

13. The planar illumination device according to claim 1, wherein the light source comprises three of the terminals, the substrate comprises a pair of first land portion and a second land portion as the plurality of land portions being arranged along a longitudinal direction of the substrate, the pair of first land portions being arranged at both ends of the longitudinal direction of the substrate, and the second land portion being interposed between the pair of first land portions of the longitudinal direction of the substrate,
each of the three terminals is bonded with each of the pair of first land portions and the second land portion,
the second land portion has a pair of cutouts provided by cutting from each sides facing each of the pair of first land portions.

14. The planar illumination device according to claim 1, wherein
the terminals are provided on a circumferential surface of a recess that is provided to the surface other than the light-emitting surface,
each of the land portions has the cutout provided by cutting the side of the light-emitting surface toward the corresponding terminal, the cutout being formed to have tapered shape in such a manner that a length of the distal end that is an end more distant from the light-emitting surface is less than a length of a proximal end that is an end closer to the light-emitting surface, and
an interval between the terminals provided on the circumferential surface of the recess and the land portions is larger than an interval between a bottom surface of the light source and the land portions.

15. The planar illumination device according to claim 1, wherein the corresponding terminal extends from a surface on the opposite side of the light-emitting surface to the first direction toward which the light is output from the light emitting surface of the light guide plate.

16. The planar illumination device according to claim 1, wherein the second direction is a direction opposite to the first direction.

17. The planar illumination device according to claim 2, wherein the second direction is a direction from one of the side surfaces of the light source toward the other of the side surfaces of the light source.

18. The planar illumination device according to claim 1, wherein a first length is a length of the bonding surface in the second direction.

19. The planar illumination device according to claim 1, wherein a second length is a length from a distal end of the cutout to an edge of the land portion in the second direction.

20. The planar illumination device according to claim 1, wherein the cutout does not contact a circumferential edge of the bonding surface of the corresponding terminal.

21. The planar illumination device according to claim 1, the corresponding terminal contacting the solder and the land portion in the second direction.

* * * * *